(12) United States Patent
Seto

(10) Patent No.: US 10,830,710 B2
(45) Date of Patent: Nov. 10, 2020

(54) METHOD AND DEVICE FOR INSPECTING A SEMICONDUCTOR DEVICE

(71) Applicant: Toshiba Memory Corporation, Tokyo (JP)

(72) Inventor: Motoshi Seto, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/558,803

(22) Filed: Sep. 3, 2019

(65) Prior Publication Data

US 2020/0264110 A1  Aug. 20, 2020

(30) Foreign Application Priority Data

Feb. 19, 2019  (JP) .................. 2019-027230

(51) Int. Cl.
| | | |
|---|---|---|
| *G01N 21/952* | (2006.01) | |
| *G01N 21/95* | (2006.01) | |
| *G01N 21/88* | (2006.01) | |
| *G06T 7/00* | (2017.01) | |
| *H01L 25/065* | (2006.01) | |
| *B06B 1/02* | (2006.01) | |

(52) U.S. Cl.
CPC ....... *G01N 21/952* (2013.01); *G01N 21/8806* (2013.01); *G01N 21/9501* (2013.01); *G06T 7/001* (2013.01); *B06B 1/02* (2013.01); *G01N 2201/0612* (2013.01); *G01N 2201/1087* (2013.01); *G01N 2201/11* (2013.01); *G06T 2207/30136* (2013.01); *G06T 2207/30148* (2013.01); *H01L 25/0657* (2013.01); *H01L 2225/06506* (2013.01); *H01L 2225/06562* (2013.01)

(58) Field of Classification Search
CPC .. G01N 29/00; G01N 21/952; G01N 21/8806; G01N 21/9501; G01N 29/036; G01N 29/045; G01N 2203/0055; G06T 7/001
See application file for complete search history.

(56) References Cited

U.S. PATENT DOCUMENTS

| | | | |
|---|---|---|---|
| 6,323,943 B1 | 11/2001 | Maruyama et al. | |
| 2003/0200987 A1* | 10/2003 | Cheung | H01L 21/67051 134/1.3 |
| 2012/0080806 A1* | 4/2012 | Song | H01L 23/3128 257/777 |

FOREIGN PATENT DOCUMENTS

| | | |
|---|---|---|
| JP | H02-102735 A | 4/1990 |
| JP | 2000-137026 A | 5/2000 |
| JP | 2008-084881 A | 4/2008 |

* cited by examiner

*Primary Examiner* — Steven Whitesell Gordon
(74) *Attorney, Agent, or Firm* — Kim & Stewart LLP

(57) ABSTRACT

A semiconductor device inspection device includes a semiconductor device stage, a sound wave generator, a laser emitter, a photoreceiver, and a processing circuit. The sound wave generator is configured to generate a sound wave having a natural frequency of a bonding wire included in a semiconductor device placed on the semiconductor device stage. The laser emitter is configured to direct laser toward the bonding wire while the sound wave generator generates the sound wave. The photoreceiver is configured to receive the laser reflected by the bonding wire and output a signal corresponding to the received laser. The processing circuit is configured to detect a bonding failure of the bonding wire based on the signal output by the photoreceiver.

17 Claims, 9 Drawing Sheets

METHOD AND DEVICE FOR INSPECTING A SEMICONDUCTOR DEVICE

CROSS-REFERENCE TO RELATED APPLICATION

This application is based upon and claims the benefit of priority from Japanese Patent Application No. 2019-027230, filed Feb. 19, 2019, the entire contents of which are incorporated herein by reference.

FIELD

Embodiments described herein relate generally to a method and device for inspecting a semiconductor memory.

BACKGROUND

A semiconductor device is provided with a mounting substrate, a semiconductor chip disposed on the mounting substrate, and a wiring such as a bonding wire coupled to the mounting substrate and the semiconductor chip.

A known method of inspecting such a semiconductor device includes the step of inspecting the quality of coupling of the wiring such as the bonding wire and the semiconductor chip or the like. Such an inspection method may be, for example, a method of monitoring an electrostatic capacity of the bonding wire or the like when the bonding wire or the like is coupled, or a method of measuring a press-in amount when a capillary is pressed into a pad electrode or the like.

DETAILED DESCRIPTION

Embodiments provide a method and device for inspecting a semiconductor device, the device being configured for inspecting a coupling state of a wiring while preventing impact on a semiconductor chip or the like.

In general, according to an embodiment, a method for inspecting a bonding failure of a bonding wire included in a semiconductor device comprises generating a sound wave having a natural frequency of the bonding wire included in the semiconductor device, directing laser toward the bonding wire while the sound wave is generated, receiving the laser reflected by the bonding wire and outputting a signal corresponding to the received laser, and detecting a bonding failure of the bonding wire based on the output signal.

In general, according to an embodiment, a semiconductor device inspection device includes a semiconductor device stage, a sound wave generator, a laser emitter, a photoreceiver, and a processing circuit. The sound wave generator is configured to generate a sound wave having a natural frequency of a bonding wire included in a semiconductor device placed on the semiconductor device stage. The laser emitter is configured to direct laser toward the bonding wire while the sound wave generator generates the sound wave. The photoreceiver is configured to receive the laser reflected by the bonding wire and output a signal corresponding to the received laser. The processing circuit is configured to detect a bonding failure of the bonding wire based on the signal output by the photoreceiver.

Hereinafter, a method and device for inspection of a semiconductor device according to an embodiment will be described in detail with reference to the drawings. The following embodiments are merely examples, and are not shown for the purpose of limiting the present disclosure.

First Embodiment

Figure 1:
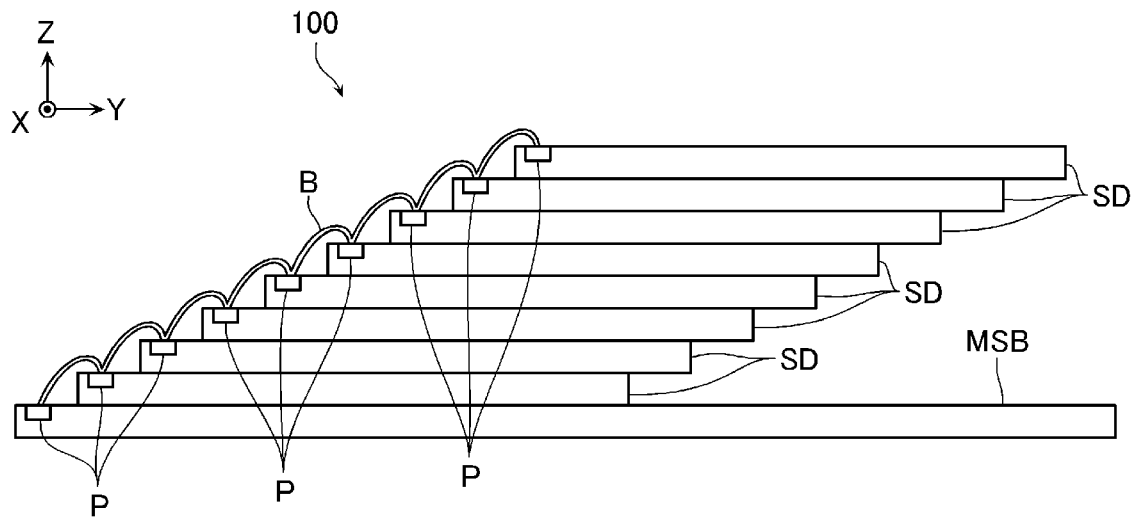
FIG. 1 shows a schematic cross-sectional view of a semiconductor device.
Figure 2:
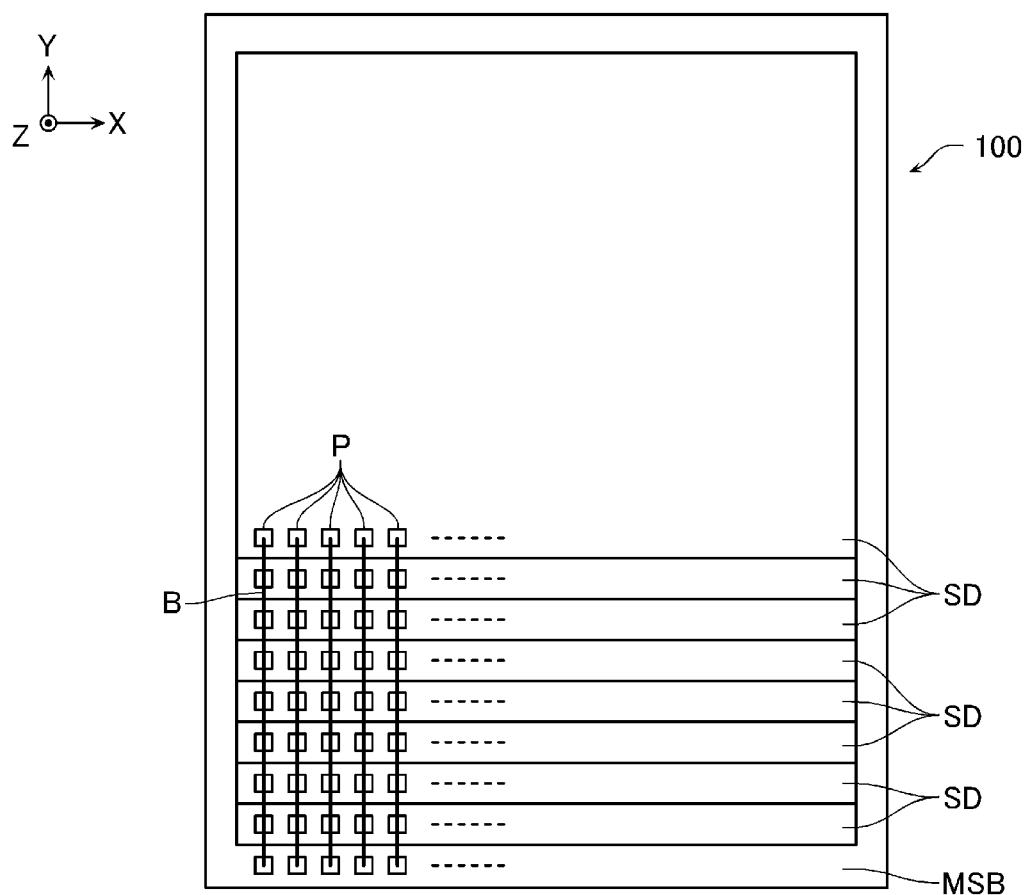
FIG. 2 shows a schematic plan view of the semiconductor device.

Semiconductor Device First, with reference to FIGS. 1 and 2, a semiconductor device 100 inspected using the inspection method and the inspection device according to the present embodiment will be briefly described. FIG. 1 shows a schematic cross-sectional view of the semiconductor device 100. FIG. 2 shows a schematic plan view of the semiconductor device 100.

As shown in FIG. 1, the semiconductor device 100 includes a mounting substrate MSB and a plurality of silicon dies SD (which are, e.g., semiconductor chips) stacked on the mounting substrate MSB. In the configuration, the mounting substrate MSB and the plurality of silicon dies SD are stacked in such a manner as to be offset in a Y direction so that a pad electrode P formed on a surface thereof is exposed, and are coupled to one another via an adhesive or the like.

As shown in FIG. 2, the mounting substrate MSB and the plurality of silicon dies SD respectively include the plurality of pad electrodes P. The mounting substrate MSB and the plurality of pad electrodes P provided on the plurality of silicon dies SD are coupled to one another via a bonding wire B, respectively.

Coupling of Bonding Wire B

Figure 3:
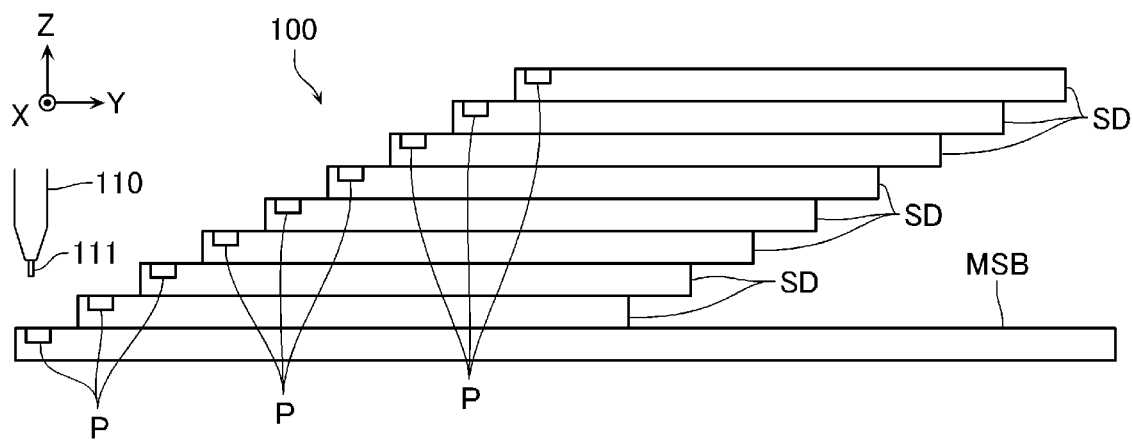
FIGS. 3-7 show a schematic cross-sectional view of a semiconductor device to describe a coupling method of a bonding wire.

When the semiconductor device 100 is manufactured, for example, as shown in FIG. 3, the plurality of silicon dies SD are disposed on the mounting substrate MSB.

Next, for example, a tip part of a capillary 110 is moved to a vicinity of the pad electrode P of the mounting substrate MSB or the like. Further, the tip part 111 of the bonding wire B is supplied to the tip part of the capillary 110.

Figure 4:
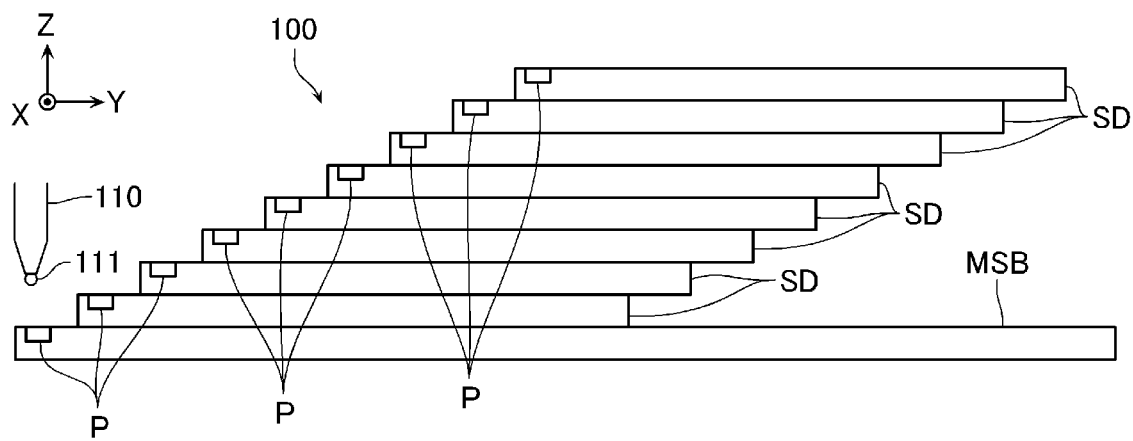

Next, as shown in FIG. 4, for example, the tip part 111 of the bonding wire B is melted by a means such as arc discharge.

Figure 5:
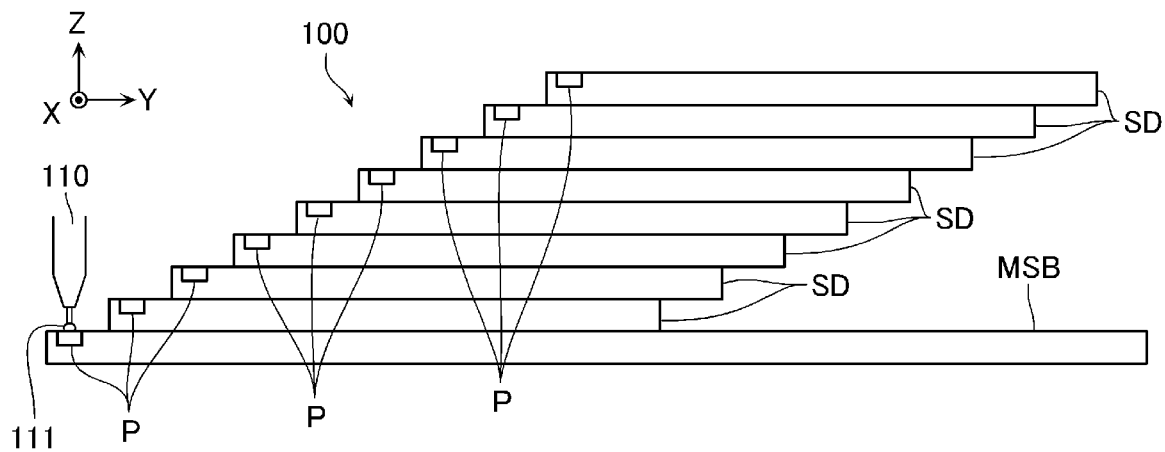

Next, for example, as shown in FIG. 5, the melted tip part 111 of the bonding wire B is brought into contact with the pad electrode P of the mounting substrate MSB or the like, and the bonding wire B is coupled to the pad electrode P.

Figure 6:
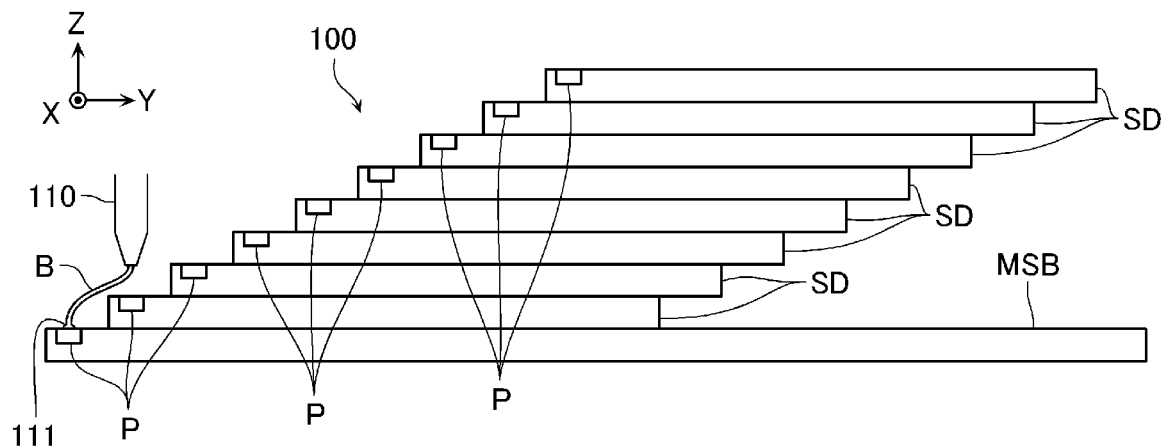

Next, for example, as shown in FIG. 6, the tip part of the capillary 110 is moved to a vicinity of another pad electrode P while supplying the bonding wire B from the tip part of the capillary 110.

Thereafter, the bonding wire B is coupled to another pad electrode P. Similarly thereinafter, the semiconductor device 100 as illustrated in FIGS. 1 and 2 is manufactured by the coupling of all the silicon dies SD and the mounting substrate MSB by the bonding wires B.

Inspection Method and Inspection Device

Figure 7:
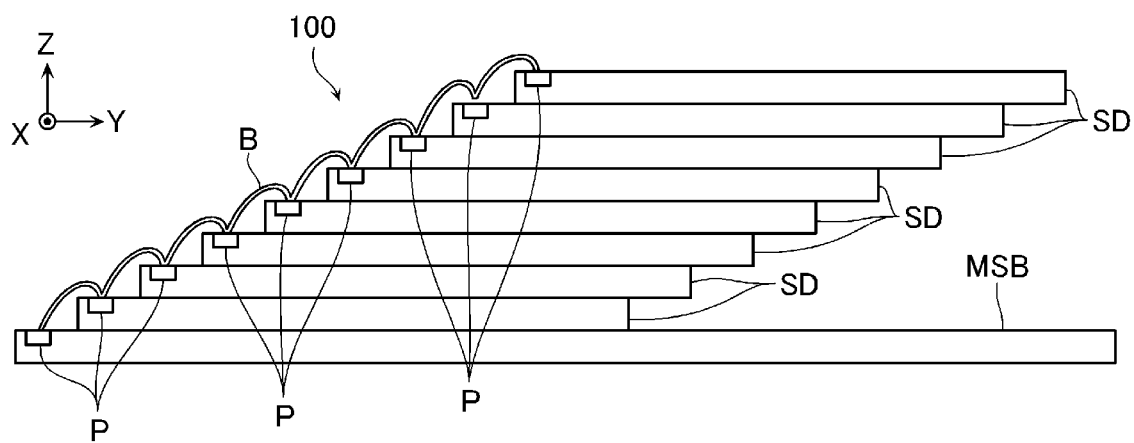

For example, as illustrated in FIG. 7 (see a portion above a pad electrode P of a second silicon die SD from the top one), the bonding wire B may be detached or may be separated and hung from the predetermined pad electrode P. Hereinafter, a coupling part between the bonding wire B and the pad electrode P may be referred to as a "coupling portion". Further, the coupling portion suitably coupled to the pad electrode P may be referred to as a "normal coupling portion". Further, the coupling portion detached or separated and hung from the pad electrode P may be referred to as a "defective coupling portion".

In the inspection method according to the present embodiment, a sound wave having a natural frequency of the bonding wire B is generated to resonate the bonding wire B, and a vibration of the bonding wire B is measured. As a result, the normal coupling portion and the defective coupling portion can be determined, and the defective coupling portion can be suitably detected. Further, according to such a method, it is possible to selectively vibrate the bonding wire B. Therefore, compared to, for example, a case where the entire semiconductor device 100 is vibrated, it is possible to prevent the impact on the mounting substrate MSB, the silicon die SD, or the like.

Figure 8:
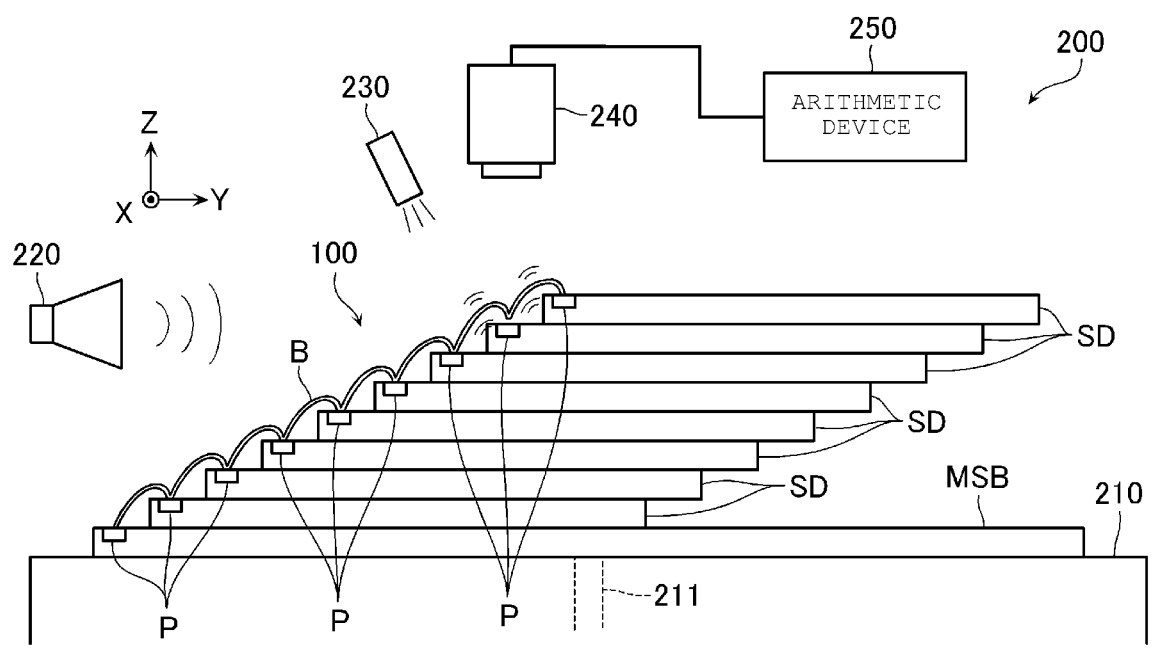
FIG. 8 shows a schematic side view of a semiconductor device inspected by an inspection device according to a first embodiment.

FIG. 8 illustrates a schematic side view of a semiconductor device inspected by an inspection device 200 according to the present embodiment. The inspection device 200 includes a sample table 210 on which the semiconductor device 100 is disposed, a sound wave generator 220 generating the sound wave having the natural frequency of the bonding wire B, a light irradiation device 230 irradiating the bonding wire B with visible light or invisible light, a light receiving device 240 receiving the visible light or invisible light, an arithmetic device 250 measuring the vibration of the bonding wire B based on an output signal of the light receiving device 240, and a control device (not shown) controlling the configuration thereof.

The sample table 210 is provided, for example, on a vibration isolation table (not shown) and holds the semiconductor device 100. The sample table 210 may be configured to be movable, for example, in at least one of an X direction and the Y direction. Further, the sample table 210 according to the present embodiment includes a holding unit 211 holding the semiconductor device 100. The holding unit 211 may be, for example, a vacuum chuck, a holding member which mechanically holds the semiconductor device 100, or any other configuration. By the semiconductor device 100 being held by the holding unit 211 or the like, it is possible to selectively vibrate the bonding wire B while suitably preventing the vibration of the entire semiconductor device 100. As a result, it is possible to prevent the impact on the mounting substrate MSB, the silicon die SD, or the like.

The sound wave generator 220 may, for example, continue to generate a sound wave of a constant frequency, or may generate a sound wave of two or more frequencies. When the sound wave of two or more frequencies is generated, the frequency may be increased or decreased continuously or substantially continuously within a predetermined range, or the frequency may be increased or decreased intermittently.

The light irradiation device 230 may emit the visible light or may emit the invisible light. Further, the light irradiation device 230 may include a light source which performs illumination over a predetermined range, or may include a point light source such as a point laser or a line light source such as a line laser. Further, an irradiation range of the visible light or the invisible light emitted from the light irradiation device 230 may include the entirety of one or more semiconductor devices 100 or may include one or more pad electrodes P. The light irradiation device 230 may be referred to as a laser emitter.

Further, the light irradiation device 230 may include an optical unit such as a galvano mirror or a micro mirror device which moves an irradiation position of the visible light or the invisible light emitted from the light source. According to such a configuration, it is possible to perform an inspection at a high speed as compared to, for example, moving a probe head mechanically.

The light receiving device 240 receives the visible light or the invisible light emitted from the light irradiation device 230 and reflected by the bonding wire B or the like. The light receiving device 240 may be an imaging element including a plurality of light receiving elements which are two-dimensionally arranged such as a camera, or may include one light receiving element. The light receiving device 240 may be referred to as a photoreceiver.

Figure 9:
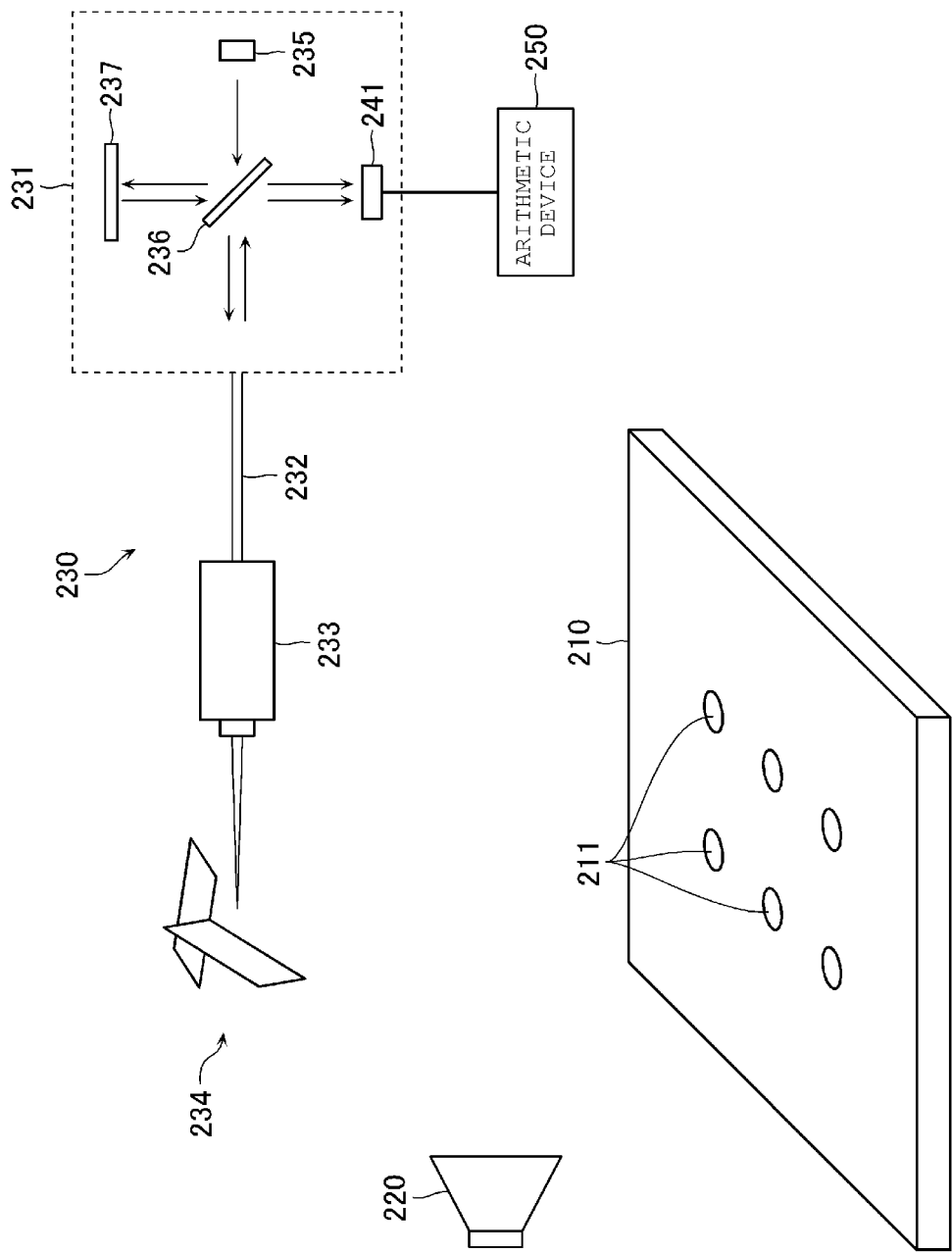
FIG. 9 shows a schematic perspective view of the inspection device.

FIG. 9 illustrates a schematic perspective view of the inspection device according to the present embodiment to explain showing a more specific configuration thereof.

The light irradiation device 230 may include, for example, a laser interferometer 231, an optical fiber 232 coupled to the laser interferometer 231, a probe head 233 coupled to the optical fiber 232, and a galvano mirror 234 which reflects laser light emitted from the probe head 233.

The laser interferometer 231 may include a laser diode 235, a half mirror 236 which transmits a part of laser light emitted from the laser diode 235 and reflects a part of the laser light, a mirror 237 which further reflects the reflected light from the half mirror 236, and a light receiving element 241 which receives a reflected light from the semiconductor device 100 and the reflected light from the mirror 237.

The arithmetic device 250 may be, for example, an FFT (Fast Fourier Transform) analyzer or the like. The arithmetic device 250 may be referred to as a processing circuit.

Figure 10:
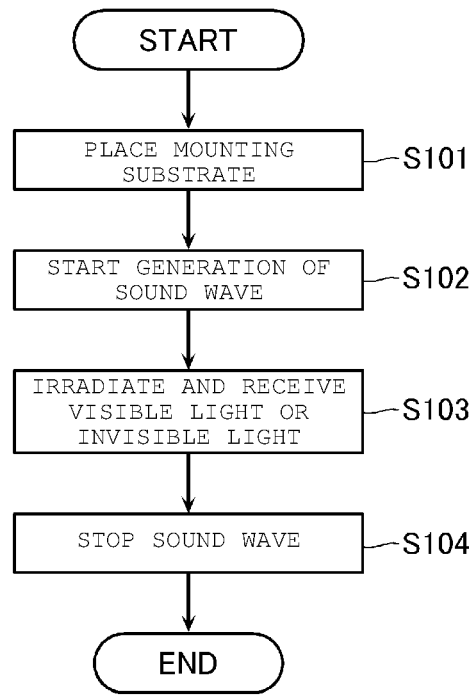
FIG. 10 shows a flowchart to explain an inspection method according to the first embodiment.

FIG. 10 is a flowchart to explain the inspection method according to the present embodiment.

Figure 11:
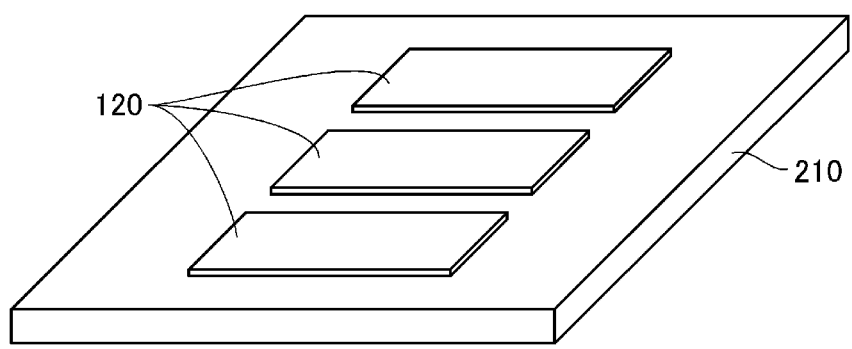
FIG. 11 shows a schematic perspective view of a semiconductor device to explain the inspection method.
Figure 12:
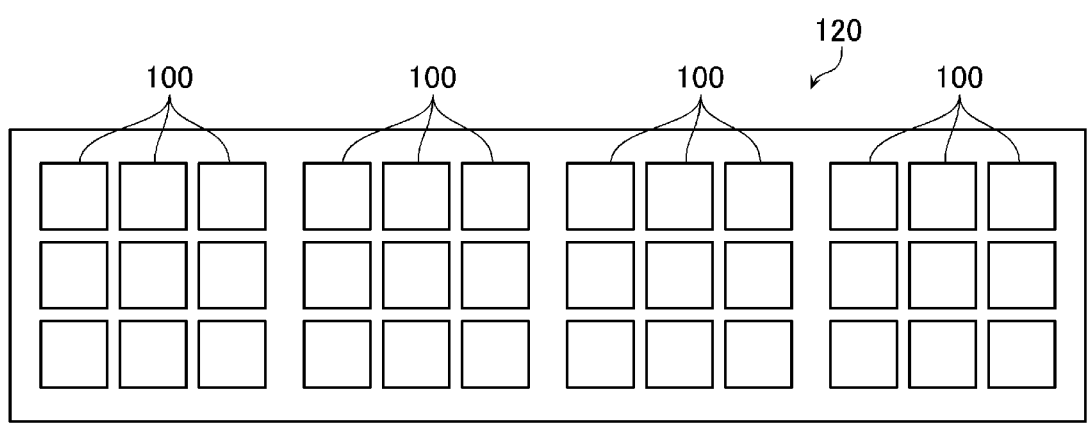
FIG. 12 shows a schematic plan view of a sample.

In a step S101, for example, as shown in FIG. 11, a plurality of samples 120 are placed on the sample table 210. When the holding unit 211 is provided on the sample table 210, holding of the sample 120 may be started in the step S101. In the illustrated example, each of the plurality of samples 120 is held by the holding unit 211. Further, for example, as shown in FIG. 12, the sample 120 includes the plurality of semiconductor devices 100 aligned in the X direction and the Y direction in the illustrated example.

In a step S102, generation of a sound wave by the sound wave generator 220 is started. As a result, the plurality of bonding wires B provided on the plurality of samples 120 resonate. Here, the coupling between the bonding wire B and the pad electrode P usually does not vibrate so much. On the other hand, the defective coupling portion vibrates relatively large. The sample table 210 does not vibrate.

In a step S103, irradiation and reception of the visible light or the invisible light are performed.

Figure 13:
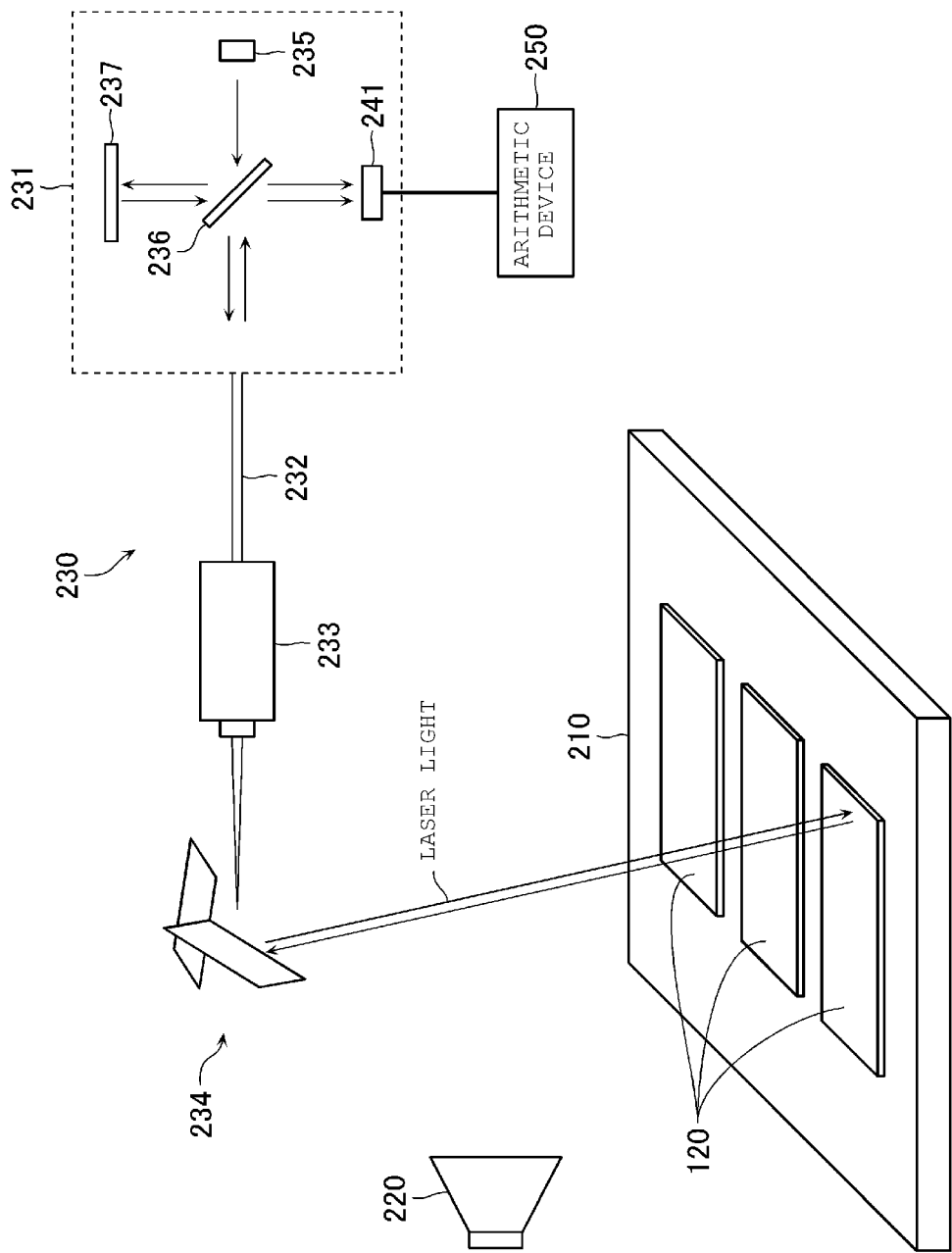
FIG. 13 shows a schematic perspective view of an inspection device to explain the inspection method.

For example, as illustrated in FIG. 13, the laser light is emitted from the laser diode 235. The laser light is irradiated to the sample 120 through the half mirror 236, the optical fiber 232, the probe head 233 and the galvano mirror 234. Further, the laser light is reflected by the sample 120 and irradiated to the half mirror 236 through the galvano mirror 234, the probe head 233, and the optical fiber 232. Further, the laser light is received by the light receiving element 241 in a state interfering with a reflected wave from the mirror 237. An intensity of the output signal of the light receiving element 241 increases or decreases in response to positional displacement due to the vibration of the bonding wire B.

Figure 14:
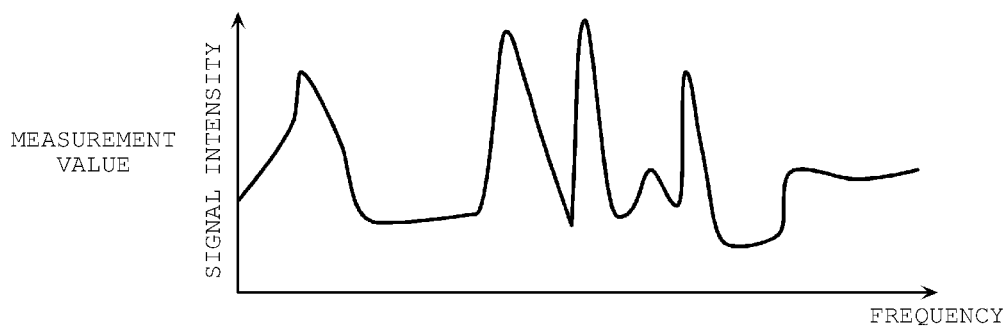
FIG. 14 shows a schematic graph illustrating a measurement value output from the light receiving element.

For example, as shown in FIG. 14, the arithmetic device 250 calculates a magnitude of each frequency component of the output signal of the light receiving element 241. For example, the output signal of the light receiving element 241 is sampled, and operation such as Fast Fourier Transform is performed.

Figure 15:
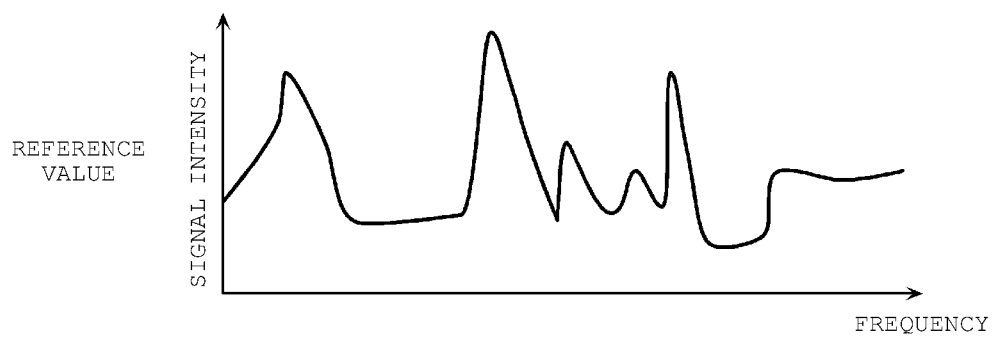
FIG. 15 shows a schematic graph illustrating a reference value.
Figure 16:
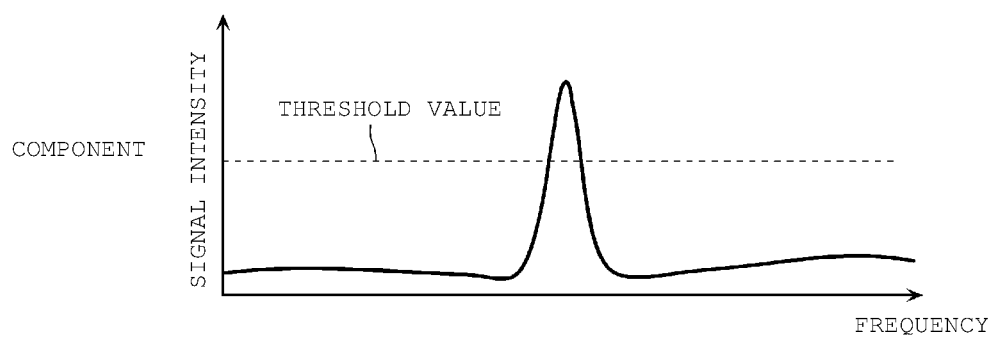
FIG. 16 shows a schematic graph illustrating a difference between the measurement value and the reference value.

Further, the arithmetic device 250, for example, calculates a difference between a calculated value and a reference value. The reference value may have a different magnitude for each frequency component, as shown in FIG. 15, for example. The reference value may be, for example, a value obtained when the laser light is irradiated to the sample 120 which does not include the defective coupling portion. In this case, a difference between the measurement value and the reference value becomes smaller than a threshold across all frequency components at a timing when the defective coupling portion is not included in the irradiation range of the laser light. On the other hand, at a timing when the defective coupling portion exists in the irradiation range of the laser light, as illustrated in FIG. 16, the difference between the measurement value and the reference value becomes larger than the threshold value.

Further, the arithmetic device 250 determines whether or not the difference is smaller than the threshold across all frequency components, and outputs a signal indicating normality when the difference is smaller than the threshold or otherwise outputs a signal indicating a defect.

Next, the irradiation position of the laser light on the sample 120 is moved by the galvano mirror 234, and the same processing is performed. Similarly thereinafter, while moving the irradiation position of the laser light on the sample 120 by the galvano mirror 234, the same processing is performed.

Thereafter, the sound wave is stopped in a step S104, and the inspection is finished.

In addition, in order to perform an inspection at high speed, it is desirable to include more coupling portions in the irradiation range of the laser light. On the other hand, in order to perform the inspection with high accuracy, it is desirable that proportion of the coupling portion in the irradiation range of the laser light is large. The irradiation range of the laser light and control of the irradiation position by the galvano mirror or the like may be adjusted in various aspects from the above viewpoint.

For example, when the point laser is scanned in the X direction and the Y direction, the laser light may be selectively irradiated to the coupling portion of the bonding wire B or the pad electrode P. Further, when scanning the line laser, extended in the X direction, in the Y direction, the laser light may be irradiated such that the irradiation includes the plurality of coupling portions or the pad electrodes P aligned in the X direction. That is, when focusing on the two coupling portions or the two pad electrodes P adjacent to each other in the X direction or the Y direction, at least one of light amount and an irradiation time of the laser light irradiated to the coupling portion and the pad electrode P may be larger than at least one of the light amount and the irradiation time of the laser light irradiated to a portion between the coupling portion and the pad electrode P. For example, the laser light may not be irradiated to a portion between the two coupling portions or the two pad electrodes P adjacent in the X direction or the Y direction.

Another Embodiment

As mentioned above, the first embodiment described above is merely an illustration, a detail thereof may be changed as appropriate.

FIG. 9 illustrates an example of the inspection device using the laser interferometer 231 as the light irradiation device 230, using the light receiving element 241 as the light receiving device 240, and using the FFT analyzer as the arithmetic device 250. However, for example, it is also possible to use an illumination device with the visible light as the light irradiation device 230 and to use an imaging element (e.g., image sensor) as the light receiving device 240. In such a case, for example, in the step S103 of FIG. 10, it is conceivable to image the coupling portion of the bonding wire B with the pad electrode P. Here, since the normal coupling portion does not vibrate so much, it is considered that an image with a relatively large contrast value is obtained. On the other hand, since the defective coupling portion vibrates relatively large, it is considered that an image with a relatively small contrast value is obtained. Therefore, the defective coupling portion can be detected by calculating the contrast value of the image by the arithmetic device 250 and comparing the contrast value with a predetermined threshold value.

Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for inspecting a bonding failure of a bonding wire included in a semiconductor device, the method comprising:
   generating and directing a sound wave having a natural frequency of the bonding wire included in the semiconductor device toward the bonding wire via an atmosphere thereof;
   directing laser toward the bonding wire while the sound wave is generated;
   receiving the laser reflected by the bonding wire and outputting a signal corresponding to the received laser; and
   detecting a bonding failure of the bonding wire based on the output signal.

2. The method according to claim 1, wherein said detecting the bonding failure comprises comparing the output signal with a reference signal corresponding to no bonding failure.

3. The method according to claim 1, wherein said directing the laser comprises scanning a laser point along the bonding wire.

4. The method according to claim 3, wherein said scanning the laser point comprises controlling scanning of the laser point such that a time period during which laser is directed to a bonding portion of the bonding wire that is bonded with a pad electrode of the semiconductor device is longer than a time period during which laser is directed to a non-bonding portion of the bonding wire extending between two adjacent bonding portions.

5. The method according to claim 3, wherein said scanning the laser point comprises controlling scanning of the laser point such that an amount of laser directed to a bonding portion of the bonding wire that is bonded with a pad electrode of the semiconductor device is greater than an amount of laser directed to a non-bonding portion of the bonding wire extending between two adjacent bonding portions.

6. The method according to claim 1, wherein said directing the laser comprises directing a line laser along the bonding wire.

7. The method according to claim 1, wherein said generating and directing the sound wave comprises incrementing or decrementing a frequency of the sound wave in a frequency range including the natural frequency of the bonding wire.

8. The method according to claim 1, wherein the semiconductor device includes:
a plurality of the semiconductor chips stacked on a substrate with an offset with each other, each of the semiconductor chips including a pad electrode on an exposed upper surface thereof, and
the bonding wire is provided along pad electrodes of the semiconductor chips.

9. The method according to claim 8, wherein the bonding failure includes misconnection of the bonding wire to a pad electrode of one of the semiconductor chips.

10. The method according to claim 8, wherein each of the semiconductor chips is a semiconductor memory chip.

11. A semiconductor device inspection device comprising:
a semiconductor device stage;
a sound wave generator configured to generate and direct a sound wave having a natural frequency of a bonding wire included in a semiconductor device placed on the semiconductor device stage toward the boding wire via an atmosphere thereof;
a laser emitter configured to direct laser toward the bonding wire while the sound wave generator generates the sound wave;
a photoreceiver configured to receive the laser reflected by the bonding wire and output a signal corresponding to the received laser; and
a processing circuit configured to detect a bonding failure of the bonding wire based on the signal output by the photoreceiver.

12. The semiconductor device inspection device according to claim 11, wherein the processing circuit is configured to compare the signal output from the photoreceiver with a reference signal corresponding to no bonding failure, to detect the bonding failure.

13. The semiconductor device inspection device according to claim 11, wherein the laser emitter is configured to scan a laser point along the bonding wire.

14. The semiconductor device inspection device according to claim 13, wherein the laser emitter is configured to control scanning of the laser point such that a time period during which laser is directed to a bonding portion of the bonding wire that is bonded with a pad electrode of the semiconductor device is longer than a time period during which laser is directed to a non-bonding portion of the bonding wire extending between two adjacent bonding portions.

15. The semiconductor device inspection device according to claim 13, wherein the laser emitter is configured to control scanning of the laser point such that an amount of laser directed to a bonding portion of the bonding wire that is bonded with a pad electrode of the semiconductor device is greater than an amount of laser directed to a non-bonding portion of the bonding wire extending between two adjacent bonding portions.

16. The semiconductor device inspection device according to claim 11, wherein the laser emitter is configured to direct a line laser along the bonding wire.

17. The semiconductor device inspection device according to claim 11, wherein the sound wave generator is configured to increment or decrement a frequency of the sound wave in a frequency range including the natural frequency of the bonding wire.

* * * * *